United States Patent
Rahmes et al.

(10) Patent No.: US 6,654,690 B2
(45) Date of Patent: Nov. 25, 2003

(54) AUTOMATED METHOD FOR MAKING A TOPOGRAPHICAL MODEL AND RELATED SYSTEM

(75) Inventors: Mark Donald Rahmes, Melbourne, FL (US); John Philip Karp, Indialantic, FL (US)

(73) Assignee: Harris Corporation, Melbourne, FL (US)

( * ) Notice: Subject to any disclaimer, the term of this patent is extended or adjusted under 35 U.S.C. 154(b) by 222 days.

(21) Appl. No.: 09/827,305

(22) Filed: Apr. 5, 2001

(65) Prior Publication Data

US 2002/0147567 A1 Oct. 10, 2002

(51) Int. Cl.[7] ................................................. G01V 3/38
(52) U.S. Cl. ................................................. 702/5; 702/6
(58) Field of Search .................................. 702/5; 703/6

(56) References Cited

U.S. PATENT DOCUMENTS

| | | | |
|---|---|---|---|
| 5,245,587 A | 9/1993 | Hutson | 367/100 |
| 5,455,591 A | 10/1995 | Hui | 342/185 |
| 5,631,970 A * | 5/1997 | Hsu | 382/113 |
| 5,652,717 A | 7/1997 | Miller et al. | 364/578 |
| 5,974,170 A | 10/1999 | Louis et al. | 382/154 |
| 5,974,423 A | 10/1999 | Margolin | 707/104 |
| 5,988,862 A * | 11/1999 | Kacyra et al. | 703/6 |
| 6,104,981 A | 8/2000 | Louis et al. | 702/5 |
| 6,323,863 B1 * | 11/2001 | Shinagawa et al. | 345/441 |

OTHER PUBLICATIONS

Real™Site 3D Urban Models, downloaded from www.gov-comm.harris.com/realsite/3dmodels.html on Feb. 21, 2001.

* cited by examiner

Primary Examiner—Marc S. Hoff
Assistant Examiner—Anthony Gutierrez
(74) Attorney, Agent, or Firm—Allen, Dyer, Doppelt, Milbrath & Gilchrist, P.A.

(57) ABSTRACT

An automated method is for making a topographical model of an area including terrain and buildings thereon based upon randomly spaced data of elevation versus position. The method may include processing the randomly spaced data to generate gridded data of elevation versus position conforming to a predetermined position grid, processing the gridded data to distinguish building data from terrain data, and performing polygon extraction for the building data to make the topographical model of the area including terrain and buildings thereon.

72 Claims, 8 Drawing Sheets

AUTOMATED METHOD FOR MAKING A TOPOGRAPHICAL MODEL AND RELATED SYSTEM

FIELD OF THE INVENTION

The present invention relates to the field of topography, and, more particularly, to an automated method and related system for making topographical models.

BACKGROUND OF THE INVENTION

Topographical models of geographical areas may be used for many applications. For example, topographical models may be used in flight simulators and for planning military missions. Furthermore, topographical models of man-made structures (e.g., cities) may be extremely helpful in applications such as cellular antenna placement, urban planning, disaster preparedness and analysis, and mapping, for example.

Various types and methods for making topographical models are presently being used. One common topographical model is the digital elevation map (DEM). A DEM is a sampled matrix representation of a geographical area which may be generated in an automated fashion by a computer. In a DEM, co-ordinate points are made to correspond with a height value. DEMs are typically used for modeling terrain where the transitions between different elevations (e.g., valleys, mountains, etc.) are generally smooth from one to a next. That is, DEMs typically model terrain as a plurality of curved surfaces and any discontinuities therebetween are thus "smoothed" over. For this reason, DEMs generally are not well suited for modeling man-made structures, such as skyscrapers in a downtown area, with sufficient accuracy for many of the above applications.

U.S. Pat. No. 6,104,981 to Louis et al. is directed to a method for assisting the detection of man-made structures in a DEM. The method includes computing isolines from a completed DEM, filtering the isolines based upon size criterion, computing extremum isolines from the filtered isolines, and isolating regions of interest, including man-made structures, from regions delimited by the extremum isolines. Even though this method may assist in distinguishing manmade structures once a DEM is rendered, the accuracy of the structures in the DEM is still limited by the curve fitting used to make the DEM.

Another approach to producing topographical models has been developed by the Harris Corporation, assignee of the present invention, and is commercially referred to as RealSite™. RealSite™ provides a semi-automated process for making three-dimensional (3D) topographical models of geographical areas, including cities, that have accurate textures and structure boundaries. Moreover, RealSite™ models are geospatially accurate. That is, the location of any given point within the model corresponds to an actual location in the geographical area with very high accuracy (e.g., within a few meters). The data used to generate RealSite™ models may include aerial and satellite photography, electro-optical, infrared, and light detection and ranging (LIDAR).

RealSite™ models not only provide enhanced accuracy over prior automated methods (such as automated DEM generation), but since they are produced using a semi-automated computer process they may be created much more rapidly than comparable manually rendered models. Yet, even though the RealSite™ model generation process begins with actual data of a geographic location, some user delineation is required to distinguish objects within an input data set before automated computer algorithms can render the final models. Thus, producing RealSite™ models for large geometric areas of several kilometers, for example, may require a significant amount of time and labor.

SUMMARY OF THE INVENTION

In view of the foregoing background, it is therefore an object of the invention to provide an automated method and related system for making a topographical model of an area including terrain and buildings thereon relatively quickly and with enhanced accuracy.

This and other objects, features, and advantages in accordance with the present invention are provided by an automated method for making a topographical model of an area including terrain and buildings thereon based upon randomly spaced data of elevation versus position. The method may include processing the randomly spaced data to generate gridded data of elevation versus position conforming to a predetermined position grid, processing the gridded data to distinguish building data from terrain data, and performing polygon extraction for the building data to make the topographical model of the area including terrain and buildings thereon.

More specifically, the randomly spaced data may include light detection and ranging (LIDAR) data, for example. Processing the randomly spaced data may include resampling the randomly spaced data based upon a polynomial fit of predetermined order. The polynomial fit of predetermined order may include at least one of an average, a tilted plane, a biquadratic, a bicubic, and a biquartic, for example. The randomly spaced data is preferably resampled using a lowest order polynomial fit for a predetermined accuracy. Further, resampling preferably uses substantially all of the randomly spaced data.

Additionally, processing the gridded data may include processing the gridded data using a plurality of position windows to distinguish the building data from the terrain data. The method may also include processing the gridded data to distinguish small features from the buildings and terrain.

Performing polygon extraction may include determining boundaries for each building based upon the building data, determining vertices of the boundaries for each building, and using the vertices to define polygons for each building. Furthermore, the boundaries for each building may be smoothed prior to determining vertices of the boundaries. The method may also include merging scaled optical images of the buildings onto the respective buildings of the topographical model as well as assigning at least one of a color and an intensity to the buildings and terrain of the topographical model based upon respective elevations thereof.

A system according to the invention is for making a topographical model of an area including terrain and buildings thereon based upon randomly spaced data of elevation versus position. The system may include a collector for collecting the randomly spaced data, a processor for receiving the randomly spaced data from the collector and making the topographical model of the area including terrain and buildings thereon, and a display connected to the processor for displaying the topographical model. The processor may make the topographical model by processing the randomly spaced data to generate gridded data of elevation versus position conforming to a predetermined position grid, processing the gridded data to distinguish building data from terrain data, and performing polygon extraction for the building data.

A computer readable medium having computer-executable instructions thereon is also provided for causing a computer to make a topographical model of an area including terrain and buildings thereon based upon randomly spaced data of elevation versus position. The instructions cause the computer to make the topographical model by performing the steps of processing randomly spaced data to generate gridded data of elevation versus position conforming to a predetermined position grid, processing the gridded data to distinguish building data from terrain data, and performing polygon extraction for the building data to make the topographical model of the area including terrain and buildings thereon.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime, double prime, and triple prime notations are used to indicate similar elements in alternative embodiments.

Figure 1:
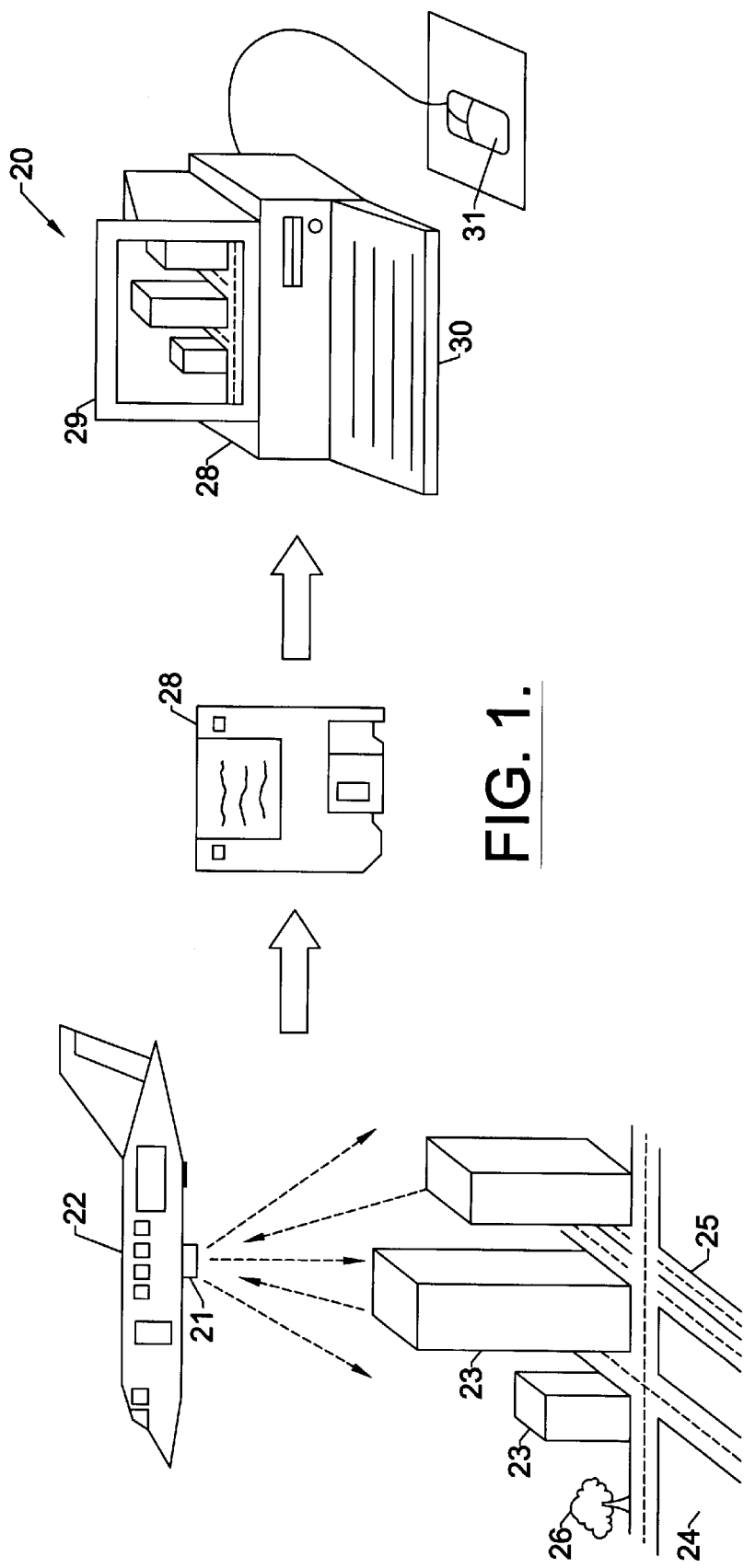
FIG. 1 is a schematic block diagram of a system for making a topographical model according to the invention.
Figure 2:
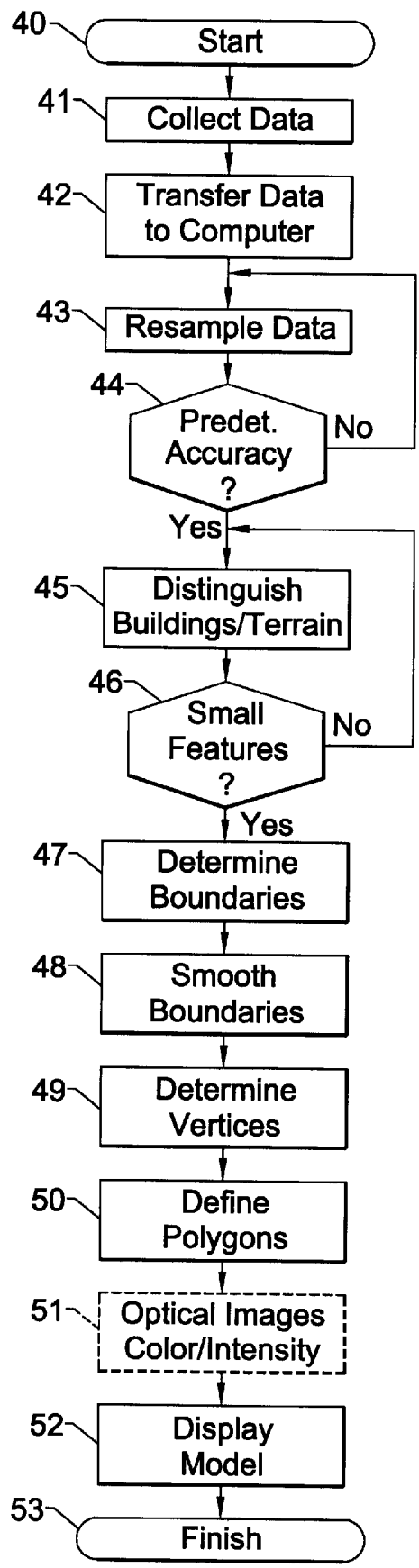
FIG. 2 is a flow diagram of a method for making a topographical model according to the invention.

Referring now to FIGS. 1 and 2, a system 20 and method according to the invention for making a topographical model is first described. The topographical model may be of an area including terrain 24 and buildings 23 thereon and is based upon randomly (or arbitrarily) spaced data of elevation versus position of the area. For example, upon beginning the method (Block 40), a collector 21, such as a light detection and ranging (LIDAR) collector, may be used for collecting the randomly spaced data, at Block 41. The randomly spaced data may nominally be a set of non-uniformly spaced measurements of position and height, for example. The LIDAR collector 21 may be carried by an airplane 22, for example, over an area (such as a city) including buildings 23 and terrain 24. The area may also include relatively small features (as compared to the buildings 23) such as roads 25 or trees 26, for example.

Those of skill in the art will appreciate that a LIDAR source provides data including elevation versus position information from a single image. That is, multiple optical images of an area taken from different perspectives are generally required to provide elevation versus position data, whereas this same information may be obtained from a single LIDAR image. Of course, the present invention may use elevation versus position data from sources such as optical (e.g., photography), electro-optical, and infrared sources, for example, in addition to LIDAR collectors, as will be appreciated by those of skill in the art. The position information provided by the LIDAR data may include latitude and longitude information, for example, though other suitable position indicators may also be used.

Once the randomly spaced data is collected, this data may be stored on a storage medium 28, such as a magnetic disk, for example, for transfer to a computer 28, as Block 42. Of course, other suitable methods for transferring data known to those of skill in the art may also be used. A display 29 (e.g., a monitor) for displaying the topographical model and input devices, such as a keyboard 30 and mouse 31, may be attached to the computer 28. The computer 28 may include a processor for receiving the randomly spaced data from the collection apparatus 21 and making the topographical model of the area including terrain and buildings thereon as will be discussed further below.

Figure 3:
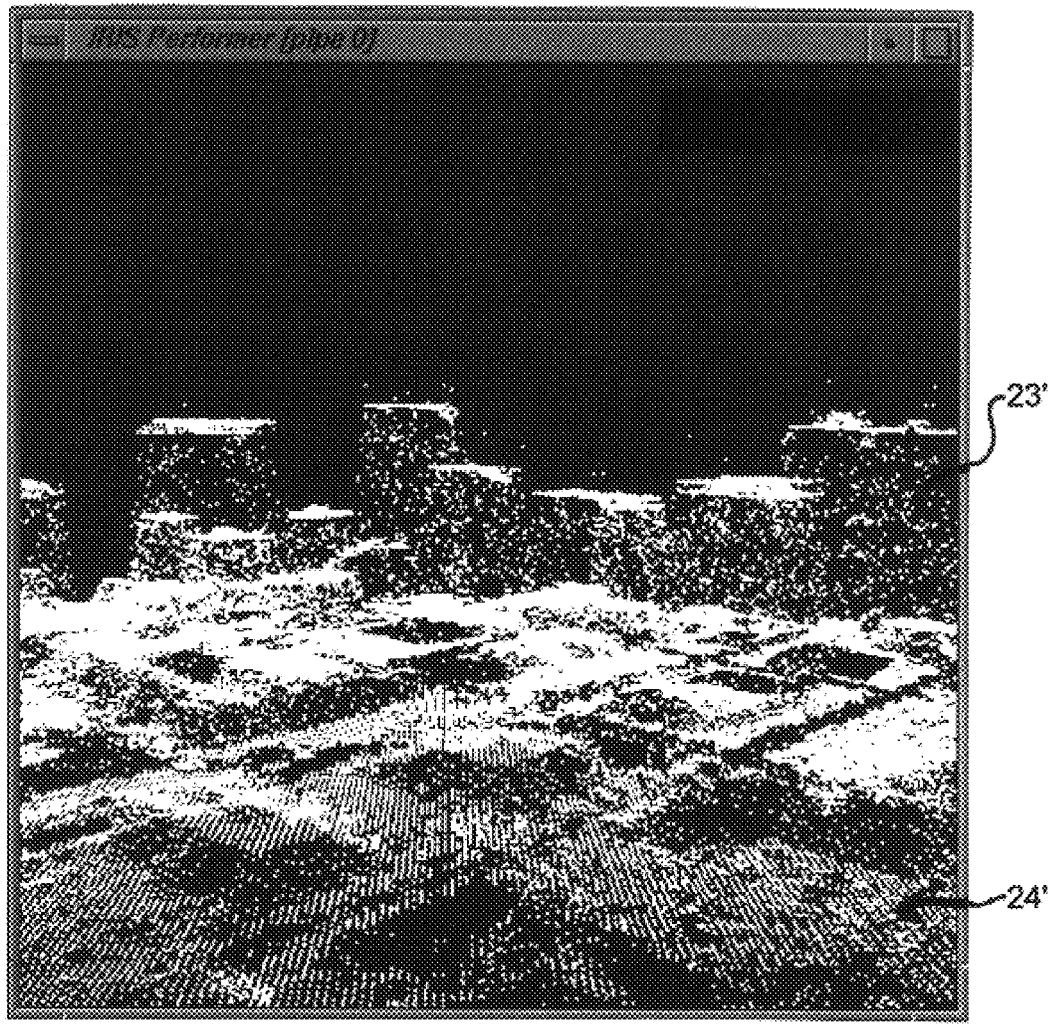
FIG. 3 is a computer screen print of randomly spaced light detection and ranging (LIDAR) data of elevation versus position for a geographical area including terrain and buildings.
Figure 4:
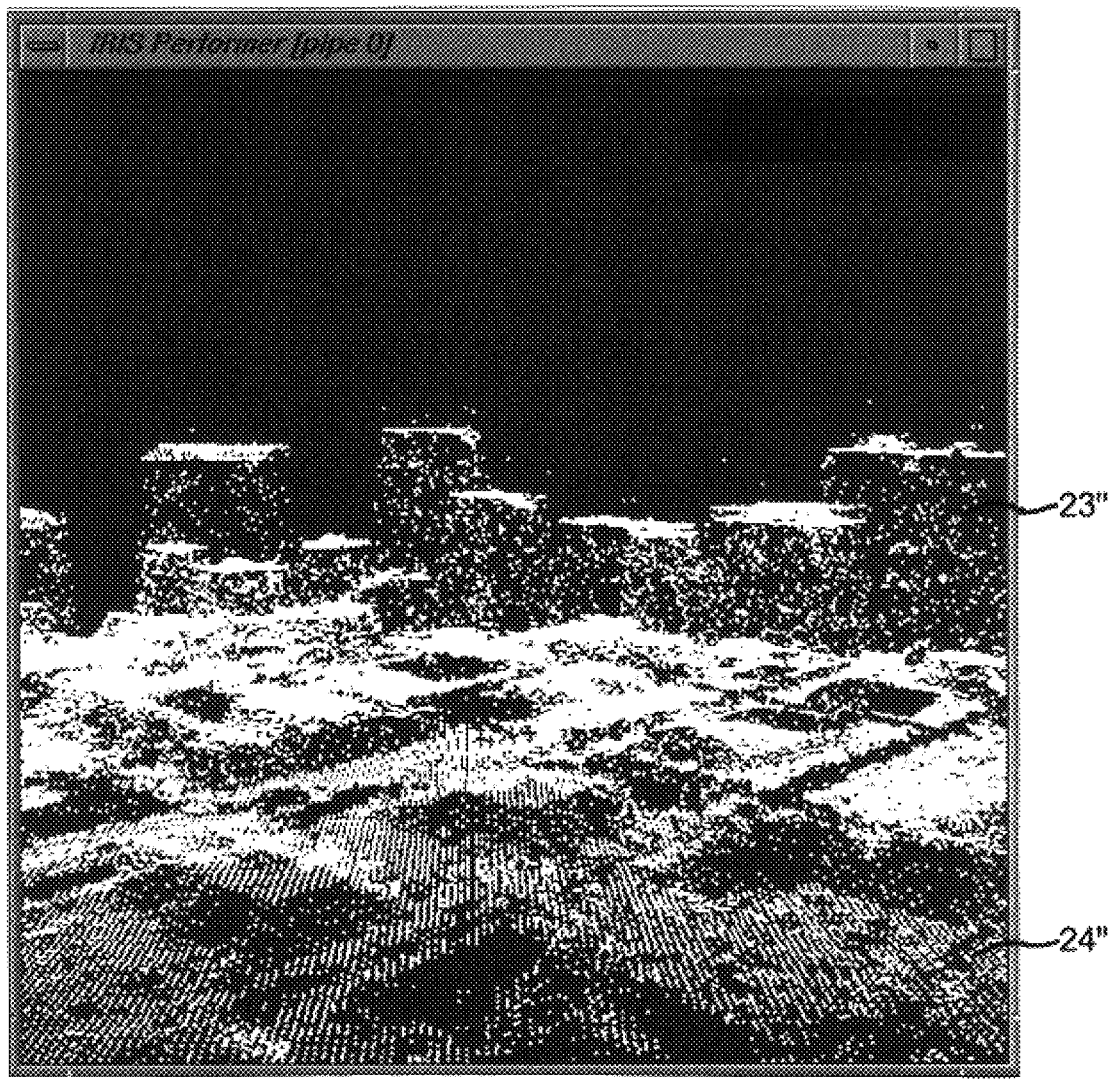
FIG. 4 is a computer screen print of the data of FIG. 3 after gridding according to the present invention.

An example of randomly spaced LIDAR data is shown in FIG. 3. The processor processes the randomly spaced building data 23' and terrain data 24' to generate gridded building data 23" and terrain data 24" of elevation versus position conforming to a predetermined position grid, as seen in FIG. 4. More specifically, the processor may process the randomly spaced data by resampling the randomly spaced data based upon a polynomial fit of predetermined order, Block 43.

The polynomial fit of predetermined order may be at least one of an average, a tilted plane, a biquadratic, a bicubic, and a biquartic, for example, although other polynomial fits known to those of skill in the art may also be used. The processor preferably resamples the randomly spaced data using a lowest order polynomial fit for a predetermined accuracy. That is, if the predetermined accuracy is not provided by a lower order polynomial fit, at Block 44, then the resampling may be repeated using progressively higher order polynomial fits until the predetermined accuracy is achieved. The resolution or space between grid locations may either be set by the user (e.g., to one meter) or may be calculated by looking at average distances between the positions of the data samples, for example.

More specifically, for each location within the grid, all points that fall within an adjustable radius of the location (i.e., a window) are fit to one of the various order two-dimensional (2D) polynomials mentioned above. Coefficients of the established polynomial are then saved for the grid location. This process is then repeated at a next grid location until all of the randomly spaced data has been gridded. The gridded data may be saved as a high resolution DEM for further processing, for example. Typical grid spacing may be about one to two meters, for example, although other grid spacings are also possible according to the present invention.

Furthermore, the processor preferably resamples substantially all of the randomly spaced data. Prior art methods for generating DEMs, for example, may exclude data during gridding and subsequent processing since the boundaries of objects therein will be fit to a curve, i.e., smoothed over.

Thus, it is not necessary to maintain substantially all of the data for a discontinuity in an object such as a building when creating a DEM according to the prior art. In contrast, the system 20 and method of the present invention retain substantially all of the randomly spaced data during gridding so that crisp and clear boundary demarcations may be made during later processing, as will be discussed further below.

Figure 5:
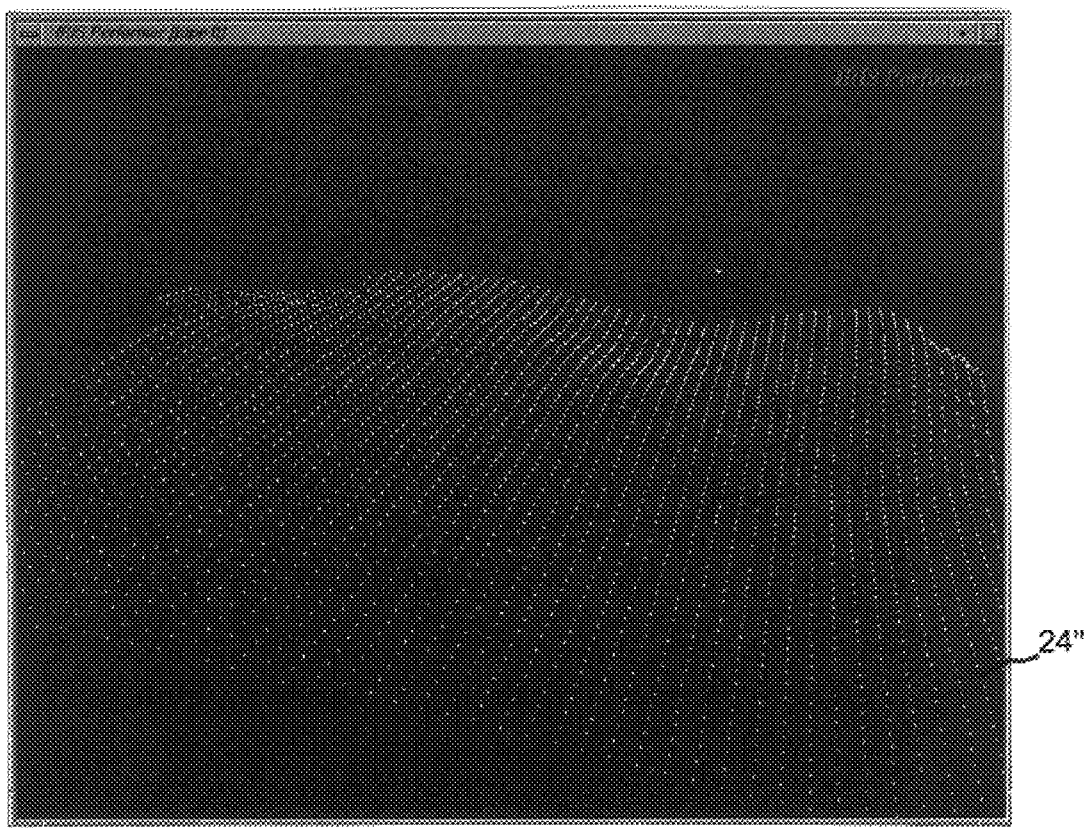
FIG. 5 is a computer screen print of the terrain data of FIG. 4 after being distinguished from the building data according to the invention.

The gridded data may next be processed to distinguish building data from terrain data, at Block 45. This processing may be done using a plurality of position windows, for example. More specifically, a second pass of sampling using windows as described above with a larger size may be performed to establish which data points are for the terrain 24. Gridded terrain data 24" of FIG. 4 is shown in FIG. 5 after it has been separated from the building data.

For convenience, a larger grid spacing (e.g., ten meters) and a lower order polynomial fit (e.g., average or tilted plane) may be used because of the amount of redundancy due to the larger window size, as will be appreciated by those of skill in the art. However, other grid spacing and polynomial fits may also be used. Again, the resulting coefficients from this second pass may be saved as a second DEM and a comparison algorithm may be used on the first and second DEMs to establish which data points are buildings 23. A third high resolution DEM including just the buildings 23 may then be created (i.e., all other points are nulled out).

If desired, small features, such as trees 26 and roads 25, may also be distinguished from the buildings and terrain by adjusting settings of the windows as described. Thus, if the windows are initially sized such that desired small features are not evident in the model, the window settings may be adjusted to provide additional detail until the desired resolution is provided (Block 46), as will be appreciated by those of skill in the art.

Figure 6:
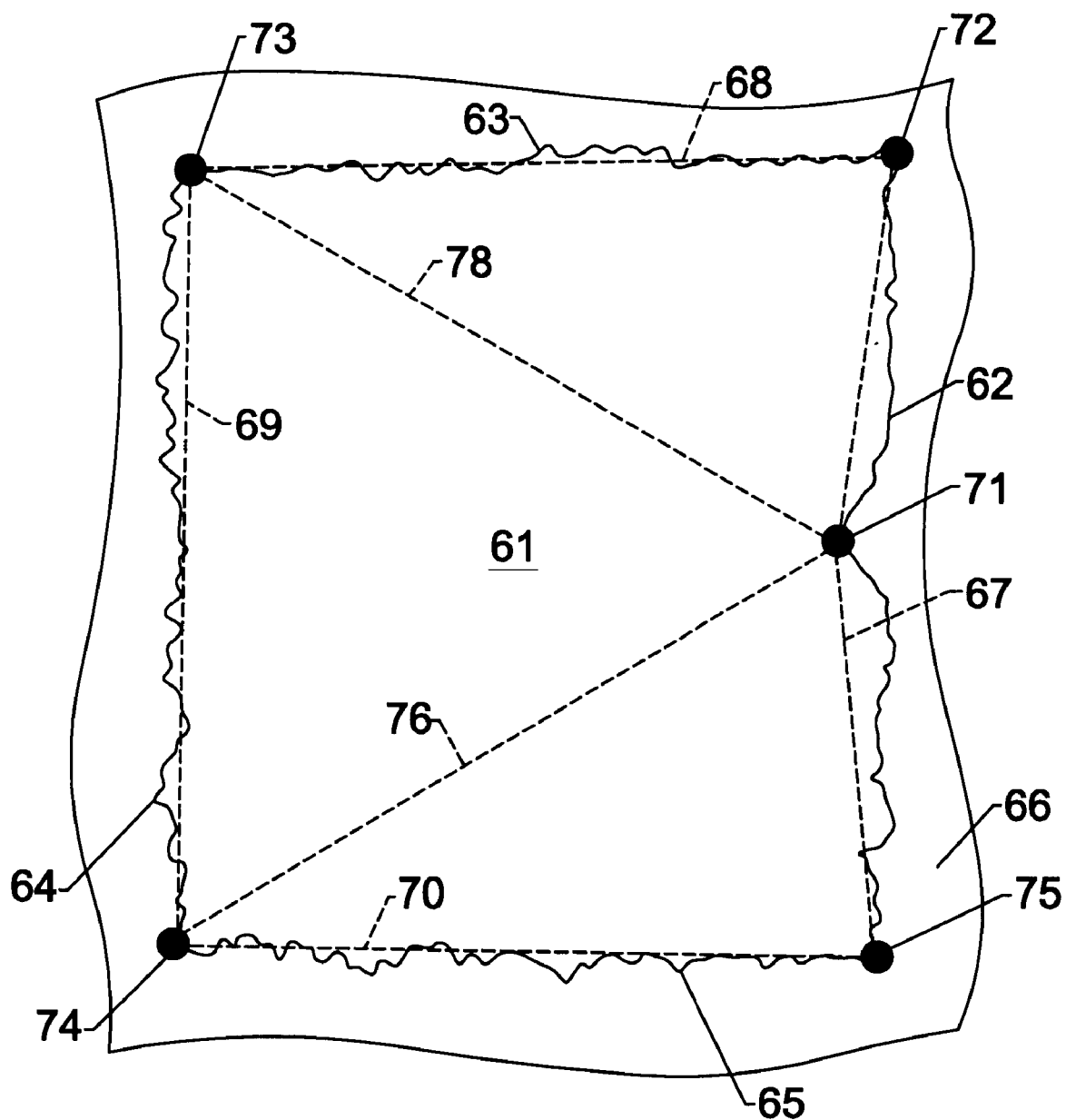
FIG. 6 is a schematic top view of building rooftop data illustrating boundary smoothing and polygon extraction according to the present invention.

The processor may then perform polygon extraction for the building data. This may be done by determining boundaries for each building based upon the building data, at Block 47. Since the buildings have previously been distinguished from the terrain, the processor may compare adjacent points along each building (or other small feature) to determine where the boundaries of the objects are. For example, a building rooftop 60 is illustratively shown in FIG. 6 that initially includes gridded data 61. Adjacent pixels within the gridded data 61 may be compared until boundaries 62–65 are delineated from terrain data 66 around the building.

The boundaries 62–65 may then be smoothed by the processor to provide substantially linear boundaries 67–70 (shown with dashed lines). Similarly, the upper surface of the rooftop 61 may also be smoothed thereacross to provide a substantially flat rooftop. Again, by adjusting the setting of the windows as discussed above, even separate elevation levels on a rooftop (e.g., an air conditioning unit) may be distinguished from the rooftop if the collected data has a sufficient resolution.

Vertices 71–75 of the boundaries 67–70 may then be determined by the processor, at Block 49. The vertices 71–75 may be used to define polygons for each building, at Block 50. That is, the polygons fill in the rooftops of the buildings and may be connected or extruded between the rooftops and the terrain to provide a 3D representation of the buildings. Similarly, vertices may also be determined along the terrain for defining polygons which form the terrain.

Figure 7:
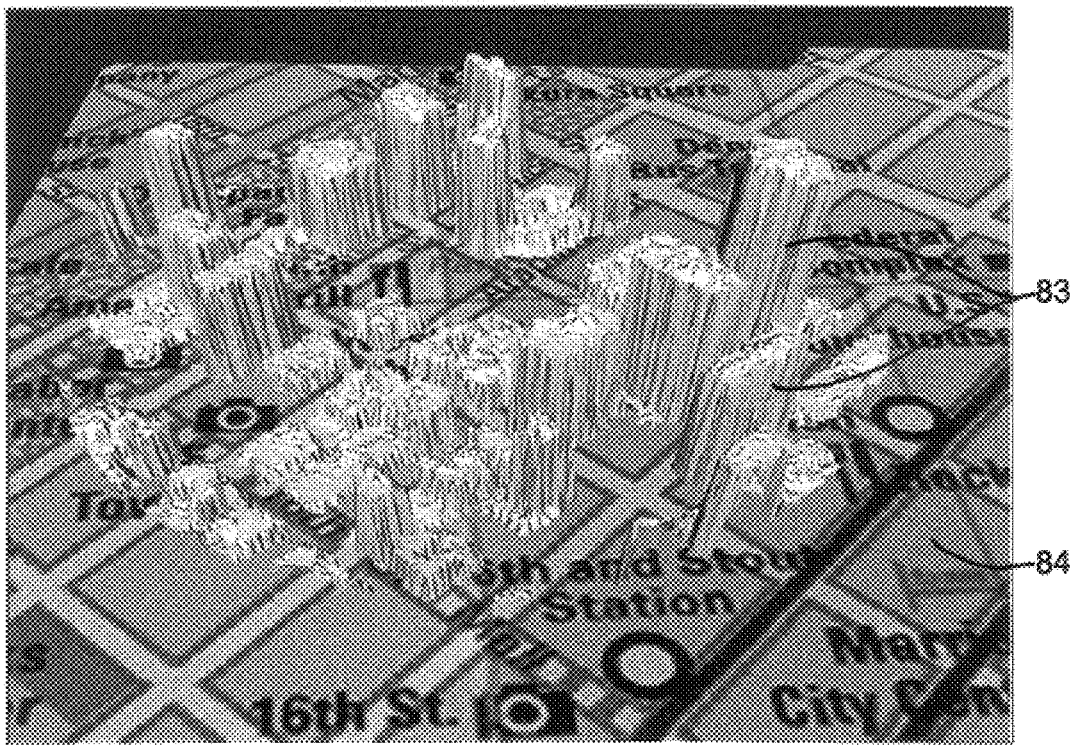
FIG. 7 is a digital elevation map of a geographical area including buildings and terrain according to the prior art.

Once the polygons have been defined, the topographical model is essentially completed. By way of comparison, a DEM including buildings 83 and terrain 84 generated using the prior art Delaunay triangulation method, which will be understood by those of skill in the art, is shown in FIG. 7. As discussed above, the discontinuities in the buildings 83 are smoothed over by this method and no crisp delineation between features and surfaces of the buildings is provided.

Figure 8:
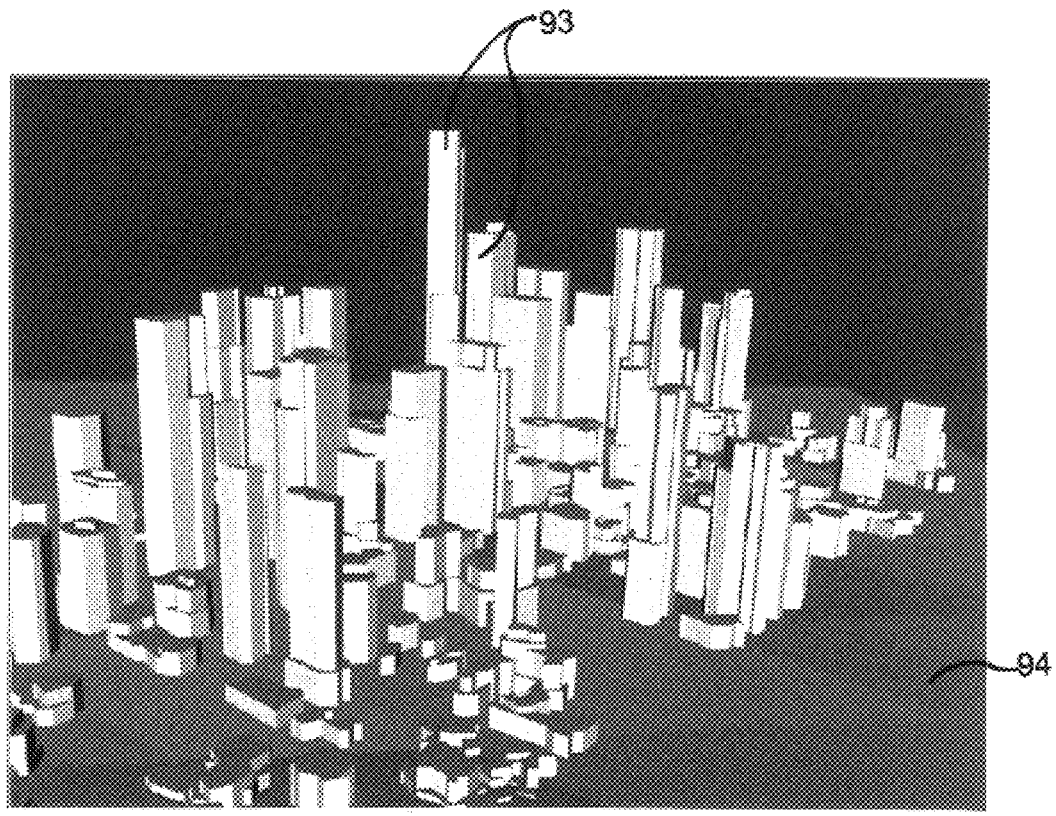
FIG. 8 is a topographical model of the city of Denver, Colo. made according to the present invention.

In contrast, a topographical model of Denver, Colo. made according to the present invention including buildings 93 and terrain 94 is illustrated in FIG. 8. As may be seen, the discontinuities in the computer generated buildings 93 are clearly and crisply delineated and appear substantially the same as those of the actual buildings. The topographical model illustrated in FIG. 8 was made from 65,000 LIDAR elevation points with a post spacing of two meters, as will be understood by those skilled in the art. The processing time required on a Sun Ultra 60 workstation to complete this model was about five minutes.

To make the topographical model even more realistic, the processor may further shade surfaces of the buildings 93, as seen in FIG. 8. Additionally, the processor may optionally merge scaled optical images of the actual buildings onto the respective buildings 93 of the topographical model and/or assign at least one of a color and an intensity to the buildings and terrain of the topographical model based upon respective elevations thereof, at Block 51. The optical images may be provided by photos of the area taken from various perspectives and scaled to the predetermined grid, for example. The topographical model may then be displayed on the display 29 (Block 52), printed, etc., thus completing the method, at Block 53.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An automated method for making a topographical model of an area including terrain and buildings thereon based upon randomly spaced data of elevation versus position, the method comprising:

processing the randomly spaced data to generate gridded data of elevation versus position conforming to a predetermined position grid;

processing the gridded data to distinguish building data from terrain data; and performing polygon extraction for the building data to make the topographical model of the area including terrain and buildings thereon.

2. The method of claim 1 wherein the randomly spaced data comprises light detection and ranging (LIDAR) data.

3. The method of claim 1 wherein processing the randomly spaced data comprises resampling the randomly spaced data based upon a polynomial fit of predetermined order.

4. The method of claim 3 wherein the polynomial fit of predetermined order comprises at least one of an average, a tilted plane, a biquadratic, a bicubic, and a biquartic.

5. The method of claim 3 wherein processing the randomly spaced data comprises resampling the randomly spaced data using a lowest order polynomial fit for a predetermined accuracy.

6. The method of claim 3 wherein resampling the randomly spaced data uses substantially all of the randomly spaced data.

7. The method of claim 1 wherein processing the gridded data comprises processing the gridded data using a plurality of position windows to distinguish the building data from the terrain data.

8. The method of claim 1 further comprising processing the gridded data to distinguish small features from the buildings and terrain.

9. The method of claim 1 wherein performing polygon extraction comprises determining boundaries for each building based upon the building data, determining vertices of the boundaries for each building, and using the vertices to define polygons for each building.

10. The method of claim 9 wherein performing polygon extraction further comprises smoothing the boundaries for each building prior to determining vertices of the boundaries.

11. The method of claim 1 further comprising merging scaled optical images of the buildings onto the respective buildings of the topographical model.

12. The method of claim 1 further comprising assigning at least one of a color and an intensity to the buildings and terrain of the topographical model based upon respective elevations thereof.

13. An automated method for making a topographical model of an area including terrain and buildings thereon based upon randomly spaced light detection and ranging (LIDAR) data of elevation versus position, the method comprising:
    processing the randomly spaced LIDAR data to generate gridded data of elevation versus position conforming to a predetermined position grid by resampling the randomly spaced data using a lowest order polynomial fit for a predetermined accuracy;
    processing the gridded data to distinguish building data from terrain data; and
    performing polygon extraction for the building data to make the topographical model of the area including terrain and buildings thereon.

14. The method of claim 13 wherein the polynomial fit of lowest order comprises at least one of an average, a tilted plane, a biquadratic, a bicubic, and a biquartic.

15. The method of claim 13 wherein resampling the randomly spaced LIDAR data uses substantially all of the randomly spaced data.

16. The method of claim 13 wherein processing the gridded data comprises processing the gridded data using a plurality of position windows to distinguish the building data from the terrain data.

17. The method of claim 13 further comprising processing the gridded data to distinguish small features from the buildings and terrain.

18. The method of claim 13 wherein performing polygon extraction comprises determining boundaries for each building based upon the building data, determining vertices of the boundaries for each building, and using the vertices to define polygons for each building.

19. The method of claim 18 wherein performing polygon extraction further comprises smoothing the boundaries for each building prior to determining vertices of the boundaries.

20. The method of claim 13 further comprising merging scaled optical images of the buildings onto the respective buildings of the topographical model.

21. The method of claim 13 further comprising assigning at least one of a color and an intensity to the buildings and terrain of the topographical model based upon respective elevations thereof.

22. An automated method for making a topographical model of an area including terrain and buildings thereon based upon randomly spaced light detection and ranging (LIDAR) data of elevation versus position, the method comprising:
    processing the randomly spaced LIDAR data to generate gridded data of elevation versus position conforming to a predetermined position grid;
    processing the gridded data using a plurality of position windows to distinguish building data from terrain data; and
    performing polygon extraction for the building data to make the topographical model of the area including terrain and buildings thereon.

23. The method of claim 22 wherein processing the randomly spaced LIDAR data comprises resampling the randomly spaced LIDAR data based upon a polynomial fit of predetermined order.

24. The method of claim 23 wherein the polynomial fit of predetermined order comprises at least one of an average, a tilted plane, a biquadratic, a bicubic, and a biquartic.

25. The method of claim 23 wherein processing the randomly spaced LIDAR data comprises resampling the randomly spaced LIDAR data using a lowest order polynomial fit for a predetermined accuracy.

26. The method of claim 23 wherein resampling the randomly spaced LIDAR data uses substantially all of the randomly spaced LIDAR data.

27. The method of claim 22 further comprising processing the gridded data to distinguish small features from the buildings and terrain.

28. The method of claim 22 wherein performing polygon extraction comprises determining boundaries for each building based upon the building data, determining vertices of the boundaries for each building, and using the vertices to define polygons for each building.

29. The method of claim 28 wherein performing polygon extraction further comprises smoothing the boundaries for each building prior to determining vertices of the boundaries.

30. The method of claim 22 further comprising merging scaled optical images of the buildings onto the respective buildings of the topographical model.

31. The method of claim 22 further comprising assigning at least one of a color and an intensity to the buildings and terrain of the topographical model based upon respective elevations thereof.

32. An automated method for making a topographical model of an area including terrain and buildings thereon based upon randomly spaced light detection and ranging (LIDAR) data of elevation versus position, the method comprising:
    processing the randomly spaced LIDAR data to generate gridded data of elevation versus position conforming to a predetermined position grid;
    processing the gridded data to distinguish building data from terrain data; and
    performing polygon extraction for the building data to make the topographical model of the area including terrain and buildings thereon by
        determining boundaries for each building based upon the building data,
        determining vertices of the boundaries for each building, and
        using the vertices to define polygons for each building.

33. The method of claim 32 wherein processing the randomly spaced LIDAR data comprises resampling the randomly spaced LIDAR data based upon a polynomial fit of predetermined order.

34. The method of claim 33 wherein the polynomial fit of predetermined order comprises at least one of an average, a tilted plane, a biquadratic, a bicubic, and a biquartic.

35. The method of claim 33 wherein processing the randomly spaced LIDAR data comprises resampling the randomly spaced LIDAR data using a lowest order polynomial fit for a predetermined accuracy.

36. The method of claim 33 wherein resampling the randomly spaced LIDAR data uses substantially all of the randomly spaced LIDAR data.

37. The method of claim 32 wherein processing the gridded data comprises processing the gridded data using a plurality of position windows to distinguish the building data from the terrain data.

38. The method of claim 32 further comprising processing the gridded data to distinguish small features from the buildings and terrain.

39. The method of claim 32 wherein performing polygon extraction further comprises smoothing the boundaries for each building prior to determining vertices of the boundaries.

40. The method of claim 32 further comprising merging scaled optical images of the buildings onto the respective buildings of the topographical model.

41. The method of claim 32 further comprising assigning at least one of a color and an intensity to the buildings and terrain of the topographical model based upon respective elevations thereof.

42. An automated method for making a topographical model of an area including terrain and buildings thereon based upon gridded data of elevation versus position conforming to a predetermined position grid, the method comprising:
processing the gridded data to distinguish building data from terrain data; and
performing polygon extraction for the building data to make the topographical model of the area including terrain and buildings thereon.

43. The method of claim 42 wherein processing the gridded data comprises processing the gridded data using a plurality of position windows to distinguish the building data from the terrain data.

44. The method of claim 42 further comprising processing the gridded data to distinguish small features from the buildings and terrain.

45. The method of claim 42 wherein performing polygon extraction comprises determining boundaries for each building based upon the building data, determining vertices of the boundaries for each building, and using the vertices to define polygons for each building.

46. The method of claim 45 wherein performing polygon extraction further comprises smoothing the boundaries for each building prior to determining vertices of the boundaries.

47. The method of claim 42 further comprising merging scaled optical images of the buildings onto the respective buildings of the topographical model.

48. The method of claim 42 further comprising assigning at least one of a color and an intensity to the buildings and terrain of the topographical model based upon respective elevations thereof.

49. A system for making a topographical model of an area including terrain and buildings thereon based upon randomly spaced data of elevation versus position, the system comprising:

a collector for collecting the randomly spaced data;
a processor for receiving the randomly spaced data from said collector and making the topographical model of the area including terrain and buildings thereon by
processing the randomly spaced data to generate gridded data of elevation versus position conforming to a predetermined position grid,
processing the gridded data to distinguish building data from terrain data, and
performing polygon extraction for the building data; and
a display connected to said processor for displaying the topographical model.

50. The system of claim 49 wherein said collector comprises a light detection and ranging (LIDAR) data collector.

51. The system of claim 49 wherein said processor processes the randomly spaced data by resampling the randomly spaced data based upon a polynomial fit of predetermined order.

52. The system of claim 51 wherein the polynomial fit of predetermined order comprises at least one of an average, a tilted plane, a biquadratic, a bicubic, and a biquartic.

53. The system of claim 51 wherein said processor processes the randomly spaced data by resampling the randomly spaced data using a lowest order polynomial fit for a predetermined accuracy.

54. The system of claim 51 wherein said processor resamples the randomly spaced data using substantially all of the randomly spaced data.

55. The system of claim 49 wherein said processor processes the gridded data by using a plurality of position windows to distinguish the building data from the terrain data.

56. The system of claim 49 wherein said processor further processes the gridded data to distinguish small features from the buildings and terrain.

57. The system of claim 49 wherein said processor performs the polygon extraction by determining boundaries for each building based upon the building data, determining vertices of the boundaries for each building, and using the vertices to define polygons for each building.

58. The system of claim 57 wherein said processor further smooths the boundaries for each building prior to determining vertices of the boundaries.

59. The system of claim 49 wherein said processor further merges scaled optical images of the buildings onto the respective buildings of the topographical model.

60. The system of claim 49 wherein said processor further assigns at least one of a color and an intensity to the buildings and terrain of the topographical model based upon respective elevations thereof.

61. A computer readable medium having computer-executable instructions thereon for causing a computer to make a topographical model of an area including terrain and buildings thereon based upon randomly spaced data of elevation versus position by performing the steps comprising:
processing randomly spaced data to generate gridded data of elevation versus position conforming to a predetermined position grid;
processing the gridded data to distinguish building data from terrain data; and
performing polygon extraction for the building data to make the topographical model of the area including terrain and buildings thereon.

62. The computer readable medium of claim 61 wherein the randomly spaced data comprises light detection and ranging (LIDAR) data.

63. The computer readable medium of claim 61 wherein processing the randomly spaced data comprises resampling the randomly spaced data based upon a polynomial fit of predetermined order.

64. The computer readable medium of claim 63 wherein the polynomial fit of predetermined order comprises at least one of an average, a tilted plane, a biquadratic, a bicubic, and a biquartic.

65. The computer readable medium of claim 63 wherein processing the randomly spaced data comprises resampling the randomly spaced data using a lowest order polynomial fit for a predetermined accuracy.

66. The computer readable medium of claim 63 wherein resampling the randomly spaced data uses substantially all of the randomly spaced data.

67. The computer readable medium of claim 61 wherein processing the gridded data comprises processing the gridded data using a plurality of position windows to distinguish the building data from the terrain data.

68. The computer readable medium of claim 61 further comprising processing the gridded data to distinguish small features from the buildings and terrain.

69. The computer readable medium of claim 61 wherein performing polygon extraction comprises determining boundaries for each building based upon the building data, determining vertices of the boundaries for each building, and using the vertices to define polygons for each building.

70. The computer readable medium of claim 69 wherein performing polygon extraction further comprises smoothing the boundaries for each building prior to determining vertices of the boundaries.

71. The computer readable medium of claim 61 wherein the instructions further cause the computer to perform the step of merging scaled optical images of the buildings onto the respective buildings of the topographical model.

72. The computer readable medium of claim 61 wherein the instructions further cause the computer to perform the step of assigning at least one of a color and an intensity to the buildings and terrain of the topographical model based upon respective elevations thereof.

* * * * *